United States Patent
Derderian

(10) Patent No.: US 7,465,650 B2
(45) Date of Patent: Dec. 16, 2008

(54) METHODS OF FORMING POLYSILICON-COMPRISING PLUGS AND METHODS OF FORMING FLASH MEMORY CIRCUITRY

(75) Inventor: Garo J. Derderian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 233 days.

(21) Appl. No.: 11/106,318

(22) Filed: Apr. 14, 2005

(65) Prior Publication Data

US 2006/0234492 A1    Oct. 19, 2006

(51) Int. Cl.
   *H01L 21/44* (2006.01)
(52) U.S. Cl. .................. 438/597; 257/E21.046
(58) Field of Classification Search .......... 438/622, 438/597; 257/E21.046
   See application file for complete search history.

(56) References Cited

U.S. PATENT DOCUMENTS 7,157,327 B2 * 1/2007 Haupt .................. 438/243

2005/0009272 A1 * 1/2005 Chen et al. ............. 438/257
2006/0022239 A1   2/2006 Mouli
2006/0115934 A1 * 6/2006 Kim et al. ............... 438/149

OTHER PUBLICATIONS

Quirk, Michael and Serda, Julian, "Semiconductor Manufacturing Technology", 2001, Prentice Hall, pp. 300 and 480.*

* cited by examiner

*Primary Examiner*—Asok K Sarkar
(74) *Attorney, Agent, or Firm*—Wells St. John P.S.

(57) ABSTRACT

This invention includes methods of forming plugs containing polysilicon, and methods of forming FLASH memory circuitry. In one implementation, a method of forming a plug containing polysilicon includes providing a substrate having an opening formed therein. Polysilicon is formed within the opening to less than fill the opening. The polysilicon within the opening is exposed to an atmosphere containing $H_2$ and a temperature of at least 500° C. After such exposing, metal is formed within the opening over the polysilicon. Other aspects and implementations are contemplated.

22 Claims, 6 Drawing Sheets

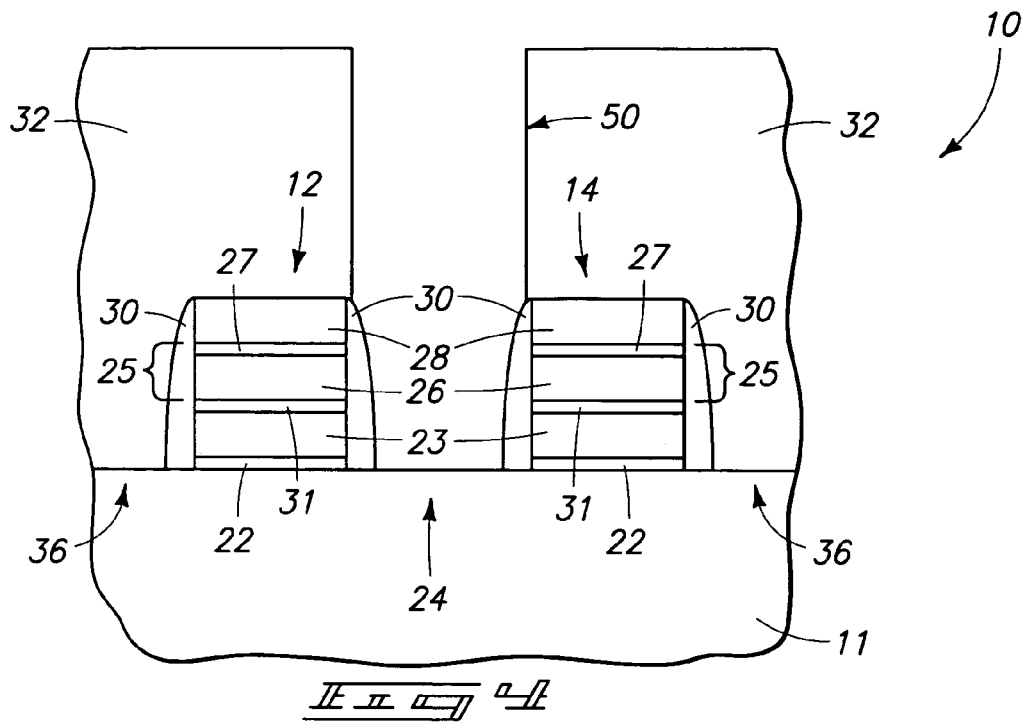
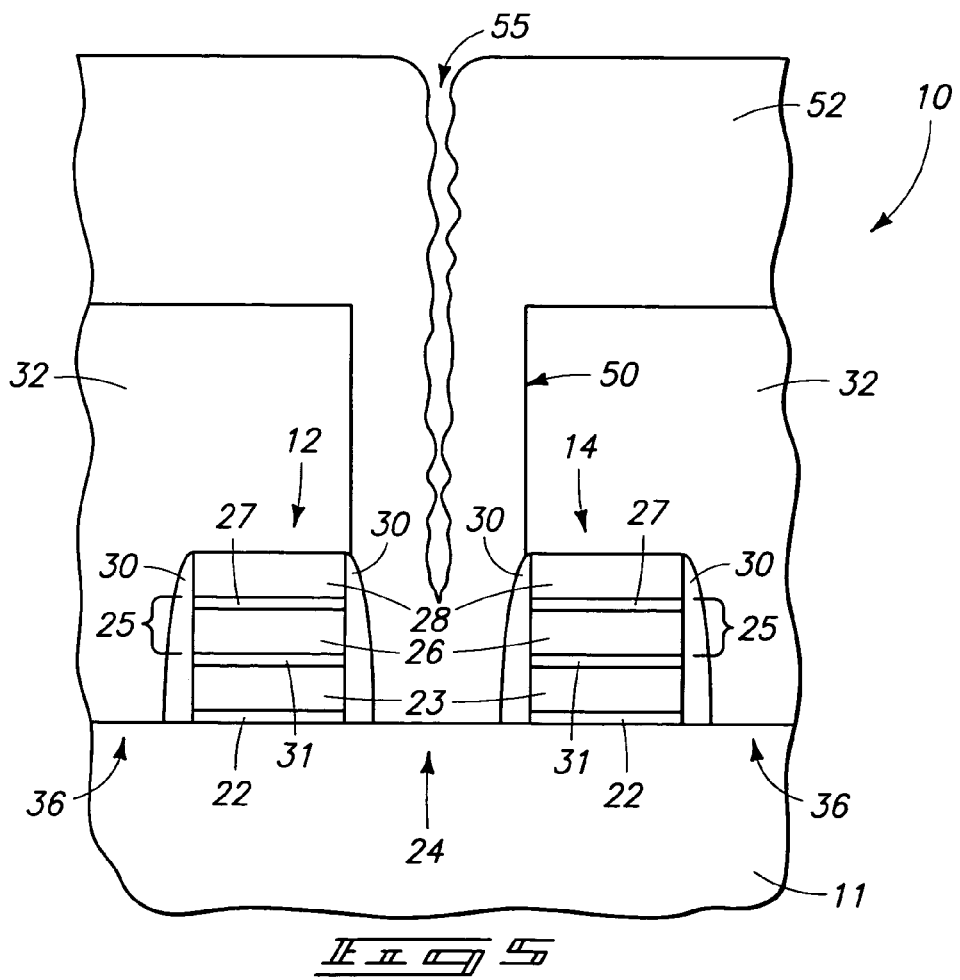

METHODS OF FORMING POLYSILICON-COMPRISING PLUGS AND METHODS OF FORMING FLASH MEMORY CIRCUITRY

TECHNICAL FIELD

This invention relates to methods of forming polysilicon-comprising plugs, and to methods of forming FLASH memory circuitry.

BACKGROUND OF THE INVENTION

Memory is but one type of integrated circuitry. Some memory circuitry allows for both on-demand data storage and data retrieval. For example, memories which allow both writing and reading, and whose memory cells can be accessed in a random order independent of physical location, are referred to as random-access memories (RAM). Read-only memories (ROMs) are those in which only the read operation can be performed rapidly. Entering data into a read-only memory is typically referred to as programming, and the operation is considerably slower than the writing operation utilized in random-access memory. With random-access memory, information is typically stored with respect to each memory cell either through charging of a capacitor or the setting of a state of a bi-stable flip-flop circuit. With either, the stored information is destroyed when power is interrupted. Read-only memories are typically non-volatile, with the data being entered during manufacturing or subsequently during programming.

Some read-only memory devices can be erased as well as written to by a programmer. Erasable read-only memory typically depends on the long-term retention of electronic charge as the information storage mechanism. The charge is typically stored on a floating semiconductive gate, such as polysilicon. One type of read-only memory comprises FLASH memory. Such memory can be selectively erased rapidly through the use of an electrical erase signal.

A FLASH memory cell typically comprises a single floating gate transistor. For multiple storage cells, such as used in large semiconductor memories, the storage cells of the memory are arranged in an array consisting of rows and columns. The rows are typically considered as comprising individual conductive gate lines formed as a series of spaced floating gates received along a single conductive line. Source and drain regions of the cells are formed relative to active area of a semiconductor substrate, with the active areas being generally formed in lines running substantially perpendicular to the lines of floating gates. The sources and drains are formed on opposing sides of the lines of floating gates within the active area with respect to each floating gate of the array. Thus, lines (rows) of programmable transistors are formed.

Electrical connections are made with respect to each drain to enable separate accessing of each memory cell. Such interconnections are arranged in lines comprising the columns of the array. The sources in FLASH memory, however, are typically all interconnected and provided at one potential, for example ground, throughout the array. Accordingly, the source regions along a given line of floating gates are typically all provided to interconnect within the substrate in a line running parallel and immediately adjacent the line of floating gates. These regions of continuously running source area are typically interconnected outside of the array, and strapped to a suitable connection for providing the desired potential relative to all the sources within the array.

A common manner of making electrical connections with respect to each drain typically involves deposition of an insulative layer, for example borophosphosilicate glass (BPSG). Individual contact openings are etched therethrough to the drains, typically utilizing photolithographic patterning and masking techniques using photoresist. One prior art technique of filling such contact openings comprises forming a composite of polysilicon, then titanium, then titanium nitride, and finally elemental tungsten. The individual contact plugs so formed typically ultimately connect with aluminum-containing conductive lines formed elevationally outward of the insulative layer. Unfortunately, and typically with contact openings at least 5,000 Angstroms deep and having minimum aspect ratios of at least 7:1, an open seam, crack, or synonymously a crevice, can form within the deposited polysilicon and which can extend to deep within the contact openings. The polysilicon is typically recessed back to within the contact openings, and whereupon the elemental titanium, then titanium nitride and tungsten are deposited to within the openings. This thereby provides a higher conductive interface between a primary polysilicon plugging material and an overlying aluminum line to be fabricated, and desirably separates the polysilicon from the aluminum.

The polysilicon is typically first etched back by chemical mechanical polishing (CMP) or other technique. The presence of crevices tends to result in greater removal of the polysilicon from centrally within the contact openings between the contact opening sidewalls than occurs more proximate the contact opening sidewalls. Thereby in some instances, polysilicon still remains at the upper portion of the contact opening proximate the upper surface of the insulative material within which the contact openings are formed. Further, the subsequently deposited titanium, titanium nitride and tungsten might not completely cover or fill the crevices and, regardless, can result in some polysilicon, at least at the edges of the contact openings, coming into contact with aluminum of the lines which are subsequently formed. This is highly undesirable, and can lead to failed circuitry.

The invention was motivated in overcoming the above-described issues and problems associated with FLASH memory circuitry. However, the invention is in no way so limited in certain aspects, and has applicability to any method of forming a polysilicon-comprising plug as herein disclosed and claimed. Accordingly, the invention is only limited by the accompanying claims as literally worded, without interpretative or other limiting reference to the specification, and in accordance with the doctrine of equivalents.

SUMMARY

This invention relates includes methods of forming polysilicon-comprising plugs, and methods of forming FLASH memory circuitry. In one implementation, a method of forming a polysilicon-comprising plug includes providing a substrate comprising an opening formed therein. Polysilicon is formed within the opening to less than fill the opening. The polysilicon within the opening is exposed to an $H_2$-comprising atmosphere and a temperature of at least 500° C. After such exposing, metal is formed within the opening over the polysilicon.

Other aspects and implementations are contemplated.

BRIEF DESCRIPTION OF THE DRAWINGS

Preferred embodiments of the invention are described below with reference to the following accompanying drawings.

FIG. 4 is a view of the FIG. 3 substrate at a processing step subsequent to that depicted by FIG. 3.

FIG. 5 is a view of the FIG. 4 substrate at a processing step subsequent to that depicted by FIG. 4.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
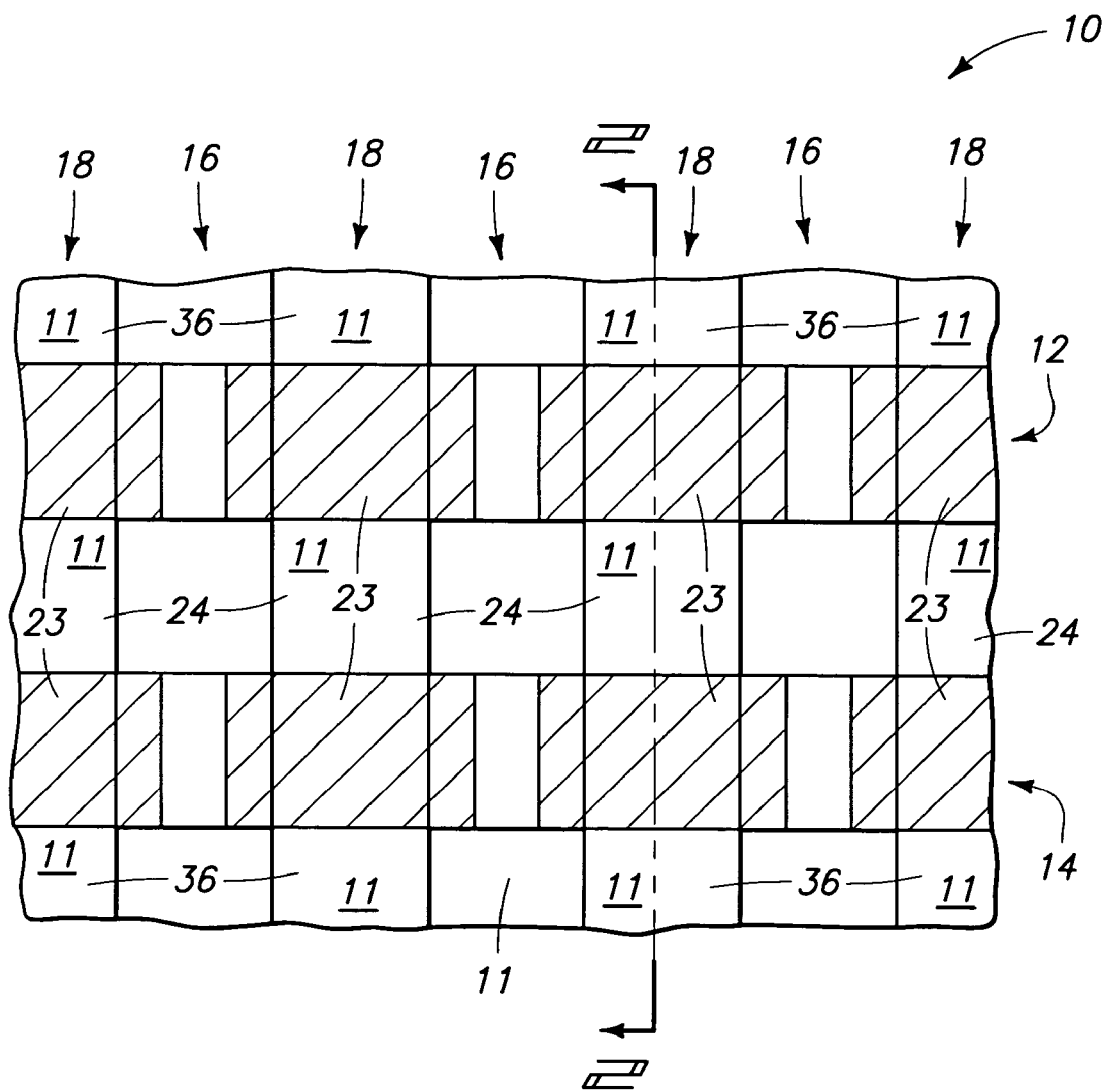
FIG. 1 is a diagrammatic top plan view of a semiconductor substrate fragment in process in accordance with an aspect of the invention.

Referring to FIG. 1, a portion of an array 10 of FLASH memory cells in fabrication is illustrated in top plan view. Such comprises a semiconductor substrate 11 having lines of floating gates 12 and 14 formed thereover. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. As illustrated, semiconductor substrate 11 is in the form of a monocrystalline silicon substrate, although semiconductor-on-insulator and other constructions, whether existing or yet-to-be developed, could also be utilized.

A series of isolation regions 16 are formed relative to semiconductor substrate 11 substantially perpendicular to the lines of floating gates 12 and 14. Such can comprise, for example, LOCOS isolation, trench and refill isolation, or other isolation whether existing or yet-to-be developed. The area 18 between isolation regions 16 thereby comprises spaced lines of active area relative to substrate 11 running between spaced isolation regions 16. The depicted area running parallel with and between lines of floating gates 12 and 14, in this exemplary embodiment and by way of example only, will eventually constitute drain areas for the respective transistors formed along lines of floating gates 12 and 14. Wafer fabrication typically and preferably comprises first fabricating the illustrated isolation regions and active areas, followed by fabrication of the lines of floating gates.

Figure 2:
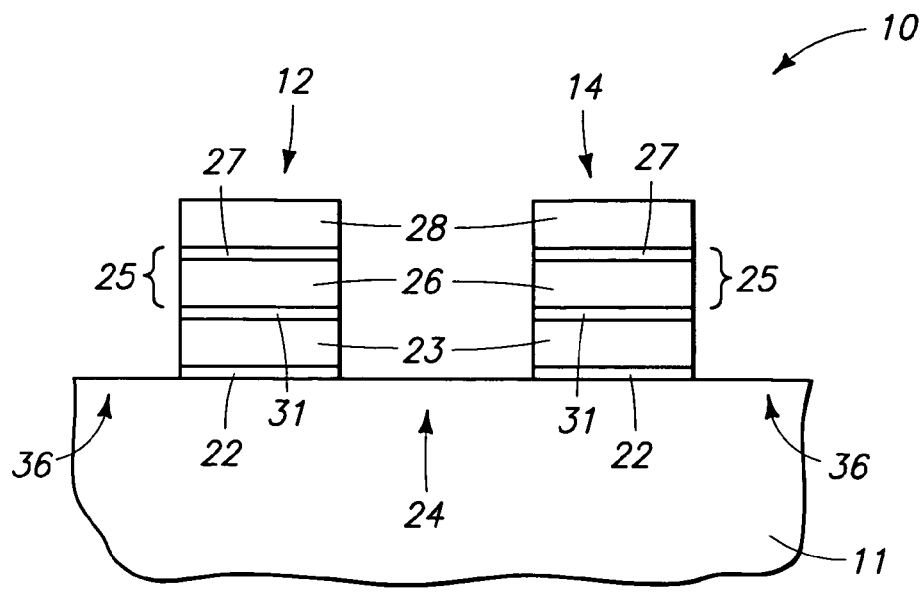
FIG. 2 is a view of the FIG. 1 substrate taken through line 2-2 in FIG. 1.

Referring to FIGS. 1 and 2, lines of floating gates 12 and 14 are depicted as constituting a gate dielectric layer 22, floating gate regions 23, a gate dielectric layer 31, a conductive line-extending portion 25 comprising a conductively doped polysilicon layer 26 and a conductive silicide layer 27, and an insulative cap 28, for example silicon nitride.

Drain and source implants in FLASH circuitry fabrication are typically separately conducted and optimized. FIGS. 1 and 2 depict exemplary drain areas 24 and source areas 36. In one exemplary preferred implementation, drain implanting is performed prior to source implanting, although the reverse or simultaneous implanting could, of course, be utilized. For example, a photoresist layer is ideally deposited and patterned (not shown) to mask the depicted floating gate word lines and source areas therebetween, and to leave the drain areas and isolation regions therebetween outwardly exposed. One or more suitable implants are then provided, typically n-type, to result in the desired depth and concentration of a conductivity-enhancing impurity to form the desired transistor drain regions within active areas 18 at locations 24. Alternately, and by way of example only, one or more blanket implants can be conducted without using a photoresist layer to fabricate the drains.

The source regions for the respective floating gate transistors are typically fabricated next, and of course can be done by any existing or yet-to-be developed technique. As mentioned above, typically all of the source regions, at least adjacent a given line of floating gates, are electrically interconnected and provided at the same potential during operation. Such might occur, by way of example only, by masking the drain areas and at least a substantial portion of the lines of floating gates, thereby leaving the typical trench isolation oxide and silicon of substrate 11 exposed laterally outward of the depicted lines of floating gates 12 and 14. Then, the trench isolation oxide between lines of floating gates 12 and 14 can be etched to leave an undulating silicon floor. Such can then be ion implanted or otherwise suitably doped to provide an electrically/conductively interconnected line of source regions 36. Alternately by way of example only, source areas 36 can be ion implanted or otherwise suitably doped without removing the oxide of the trench isolation regions, and a suitable conductive strapping layer/line formed thereover to electrically connect source areas 36 where such is desired. Such is, by way of example only, described in our U.S. Pat. Nos. 6,406,959 and 6,713,346.

The above is but one exemplary method of forming a line of floating gates over a semiconductor substrate, and of defining source areas on one side of the line proximate the floating gates, and drain areas on another side of the line proximate the floating gates. Any other method, as just so literally stated in the previous sentence, is contemplated, and whether existing or yet-to-be developed, and of course regardless of whether any conductivity-enhancing impurity is formed within the source areas in any of the above-described processing, or elsewhere, or later.

Figure 3:
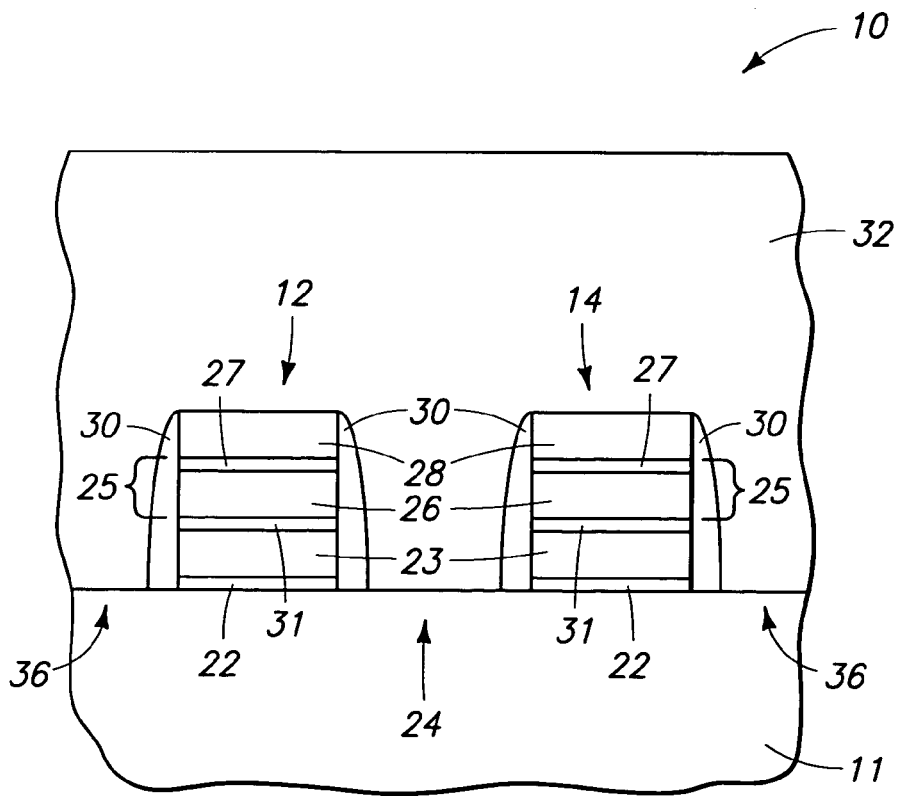
FIG. 3 is a view of the FIG. 2 substrate at a processing step subsequent to that depicted by FIG. 2.

Referring to FIG. 3, exemplary insulative sidewall spacers 30 have been formed about lines of floating gates 12 and 14, and an insulative material 32 has been formed over line of floating gates 12 and 14, source areas 36, and drain areas 24. An exemplary preferred material 32 is silicon dioxide, for example a combination of undoped silicon dioxide deposited by the decomposition of tetraethylorthosilicate (TEOS) and BPSG. An exemplary thickness range for insulative material 32 above substrate material 11 is from 6,000 Angstroms to 10,000 Angstroms.

Contact openings are formed through insulative material 32 to drain areas 24, for example as shown in FIG. 4 with respect to a contact opening 50. An exemplary preferred technique is photolithographic patterning and etch, for example utilizing photoresist as a masking layer. In one exemplary embodiment, opening 50 comprises an aspect ratio of at least 7:1, where "aspect ratio" as used herein defines the greatest depth of the opening divided by the smallest width of the opening.

Referring to FIG. 5, polysilicon 52 has been formed within the contact openings. In the depicted exemplary FIG. 5 embodiment, polysilicon 52 less than fills the depicted opening 50, and comprises a crevice 55 formed therein. Crevice 55 is typically received between the sidewalls of opening 50 more proximate to a center of such opening between the sidewalls than to the sidewalls themselves. Crevice 55 might be slightly offset from center, and might alternately, by way of example only, be centered between the sidewalls of opening 50, or perhaps less likely, more proximate the sidewalls of the opening than the center of such opening.

Figure 6:
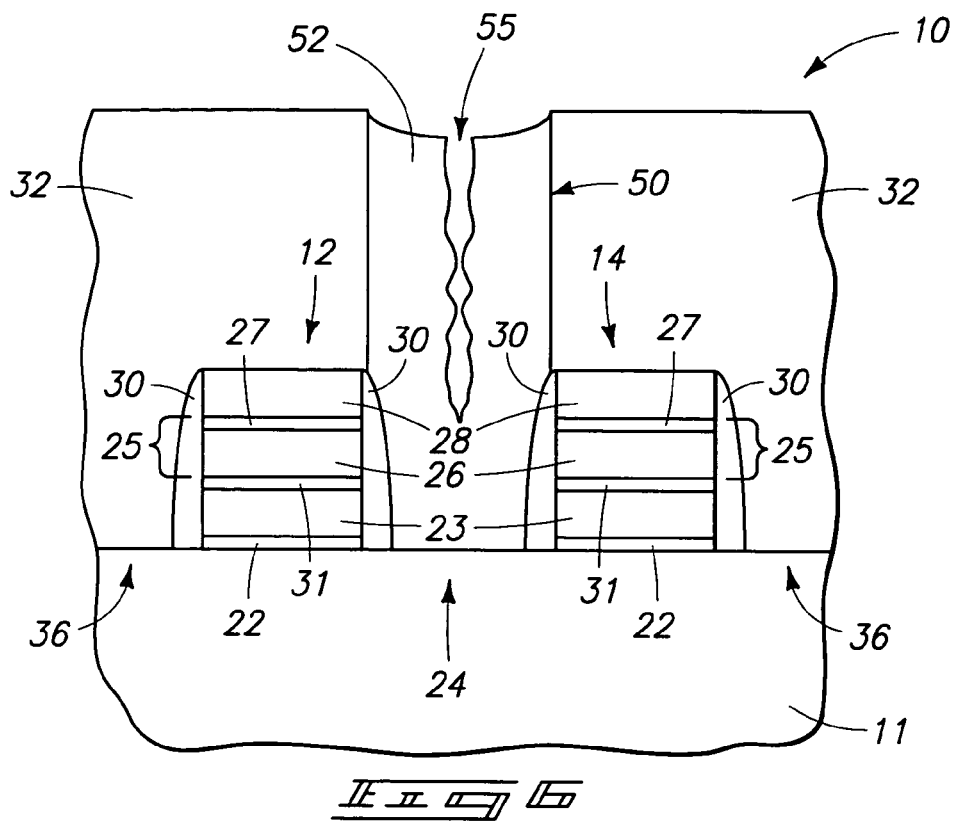
FIG. 6 is a view of the FIG. 5 substrate at a processing step subsequent to that depicted by FIG. 5.

Referring to FIG. 6, polysilicon 52 has been polished or otherwise etched back, for example by CMP.

FIGS. 5 and 6 depict but one exemplary embodiment of forming polysilicon within a contact opening to less than fill such opening, with such lack of filling in the depicted example being by a combination of recessing of the upper surface of material 52 from the upper surface of material 32 as well as the presence of crevice 55 within polysilicon material 52. However, aspects of the invention also contemplate the provision of polysilicon within an opening to less than fill the remaining volume of the opening regardless of, and in the absence of, crevice formation.

Figure 7:
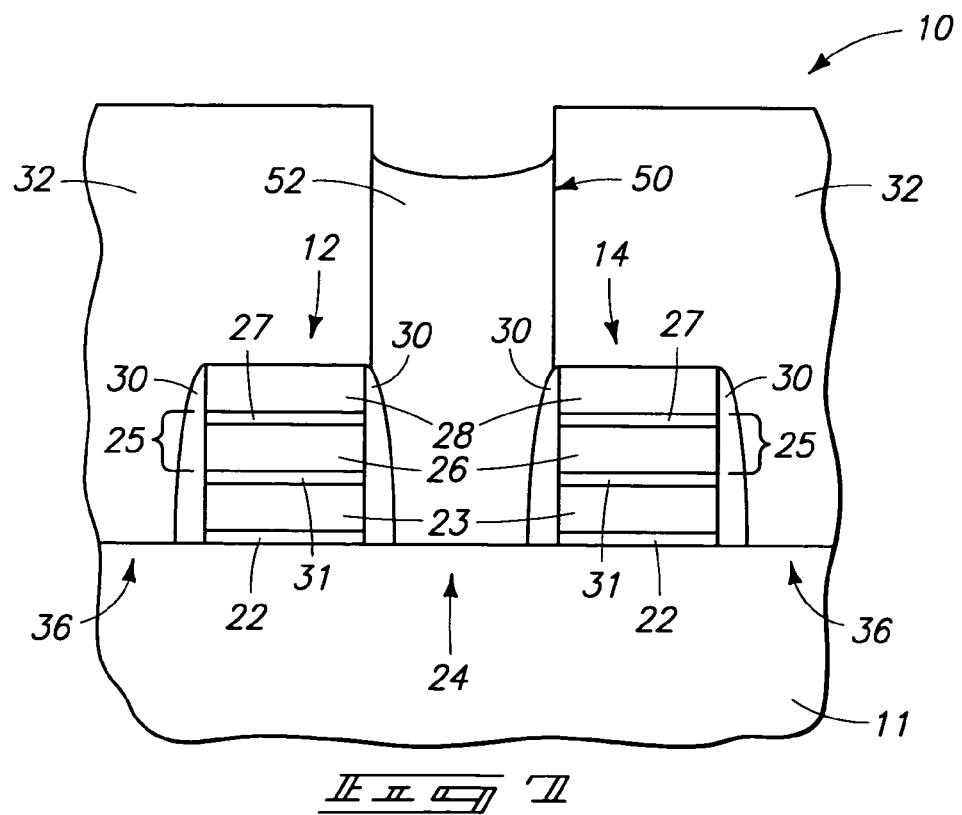
FIG. 7 is a view of the FIG. 6 substrate at a processing step subsequent to that depicted by FIG. 6.

Referring to FIG. 7, polysilicon 52 within contact opening 50 has been exposed to an $H_2$-comprising atmosphere and a temperature of at least 500° C. effective to remove crevice 55. In one preferred implementation, the atmosphere consists essentially of $H_2$, and in another preferred implementation consists of $H_2$. More preferred temperatures are at least 700° C., with preferred ranges being from 750° to 1100° C., from 900° to 1100° C., and from 775° C. to 850° C. Polysilicon 52 might be conductively doped with a conductivity-enhancing impurity prior to such exposing, subsequent to such exposing, or not at all. Most preferably, the polysilicon is conductively doped with a conductivity-enhancing impurity (i.e., to a dopant concentration of at least $1\times10^{19}$ atoms/cm$^3$) at some point to render plugging material 52 sufficiently electrically conductive.

An exemplary prior art method of forming a polysilicon plug is to conductively dope the same during deposition, and then subject the substrate to a dopant activation anneal to render the polysilicon plugging material suitably electrically conductive. An exemplary manner of doing so includes exposure to an $N_2$ atmosphere at subatmospheric pressure and 945° C. for 20 seconds. In accordance with one exemplary implementation of the invention, the exposing of the polysilicon within the opening to an $H_2$-comprising atmosphere and a temperature of at least 500° C. is effective as a dopant activation anneal, thereby precluding any requirement of a separate $N_2$ or other dopant activation anneal for material 52. Alternately by way of example only, where material 52 is undoped at this or any point in the process or where time or temperature of exposure is insufficient to cause a dopant activation anneal, the exposing can be ineffective as a dopant activation anneal. For example, a temperature exposure of from 775° C. to 850° C. will likely be ineffective by itself to result in effective/adequate dopant activation even where an adequate dopant concentration is provided in situ with the deposition of material 52.

The exposing of polysilicon 52 within opening 50 to an $H_2$-comprising atmosphere is preferably conducted at subatmospheric pressure, with a specific exemplary pressure range being from 5 Torr to 20 Torr. An exemplary preferred time of exposure is from 5 seconds to 2 minutes. By way of example only, a specific example is exposure at 945° C., a pressure of 10 Torr for 20 seconds, and at a flow rate of 14,000 sccm of $H_2$ only to a 10 liter reactor within which a single substrate is received for processing.

FIG. 7 depicts an exemplary embodiment whereby the exposing is sufficient to be ineffective to form any sealed voids within polysilicon 52 from the removed crevice. Such is believed to be facilitated by longer exposure times, perhaps even longer than 2 minutes, and at lower temperatures, for example below 900° C.

Figure 8:
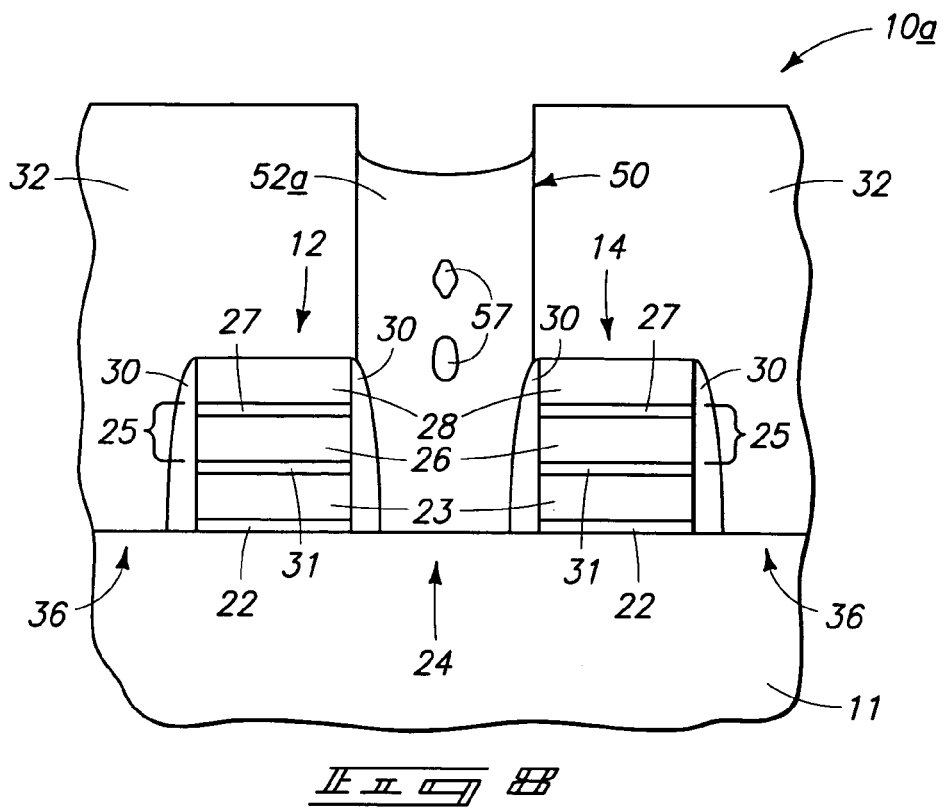
FIG. 8 is a view of a substrate fragment alternate to that depicted by FIG. 7.

FIG. 8 depicts an alternate exemplary substrate fragment 10a. Like numerals from the first-described embodiment have been utilized where appropriate, with differences being indicated with the suffix "a" or with different numerals. The exposing relative to substrate 10a is depicted as having been effective to form at least one sealed void within polysilicon 52a from crevice 55 of FIG. 6, with multiple sealed voids 57 depicted as being formed from removing crevice 55 by at least some outward sealing thereof.

Figure 9:
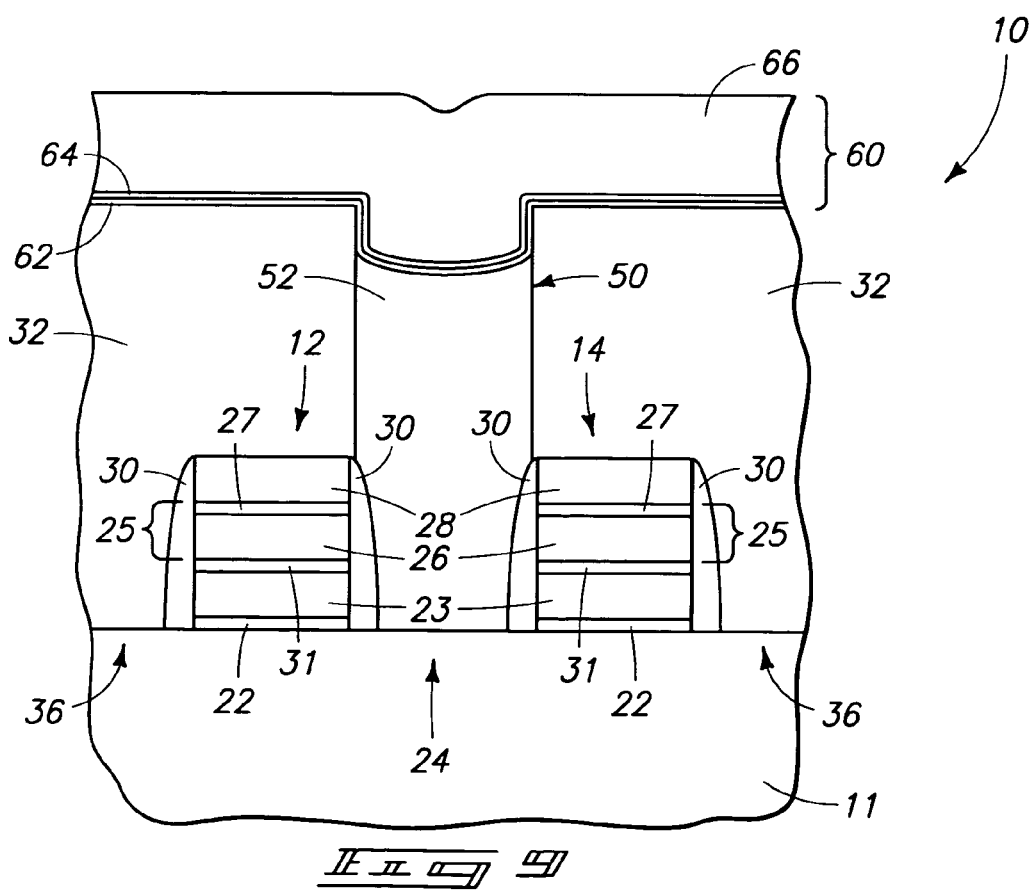
FIG. 9 is a view of the FIG. 7 substrate at a processing step subsequent to that depicted by FIG. 7.

Referring to FIG. 9 and after the $H_2$-comprising atmosphere exposure at a temperature of at least 500° C., metal 60 has been formed within opening 50 over polysilicon 52, with such preferably being formed on such polysilicon, with "on" in the context of this document meaning in at least some direct physical touching contact therewith. Further in the context of this document, "metal" defines a material comprising any one or combination of an elemental metal, an alloy, or a metal compound. In but one preferred exemplary embodiment, metal 60 is in the form of an elemental titanium layer 62, an overlying TiN layer 64, and an overlying elemental tungsten layer 66.

Polysilicon 52 within opening 50 might be exposed to $N_2$ prior to forming the metal, or not be exposed to $N_2$ prior to forming the metal. For example, and by way of example only, where the $H_2$-comprising atmosphere exposure is utilized as a substitution for a dopant activation anneal, $N_2$ exposure at any temperature might be avoided by deposition processing of the substrate of FIG. 9 in the same chamber within which the $H_2$-comprising atmosphere exposure occurs, or within another chamber without intervening exposure to an $N_2$ atmosphere. Alternately, for example, where a separate dedicated $N_2$ dopant activation anneal is conducted, or where polysilicon 52 is additionally or otherwise exposed to $N_2$ prior to forming the metal, such exposure to $N_2$ might occur prior to or after the exposing to the $H_2$-comprising atmosphere.

Figure 10:
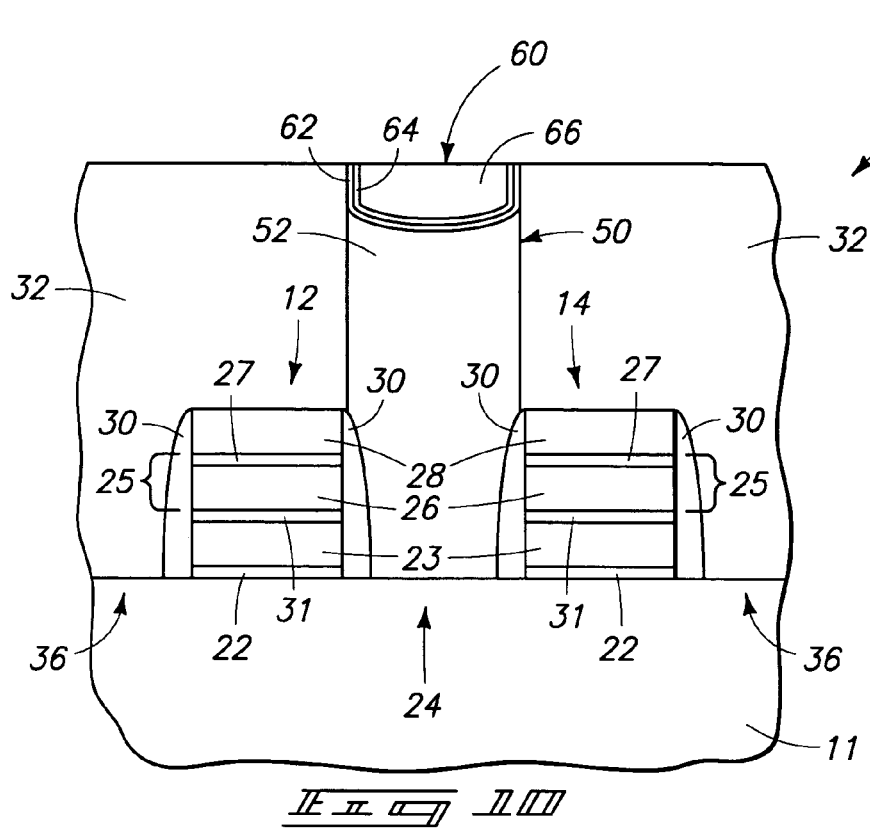
FIG. 10 is a view of the FIG. 9 substrate at a processing step subsequent to that depicted by FIG. 9.
Figure 11:
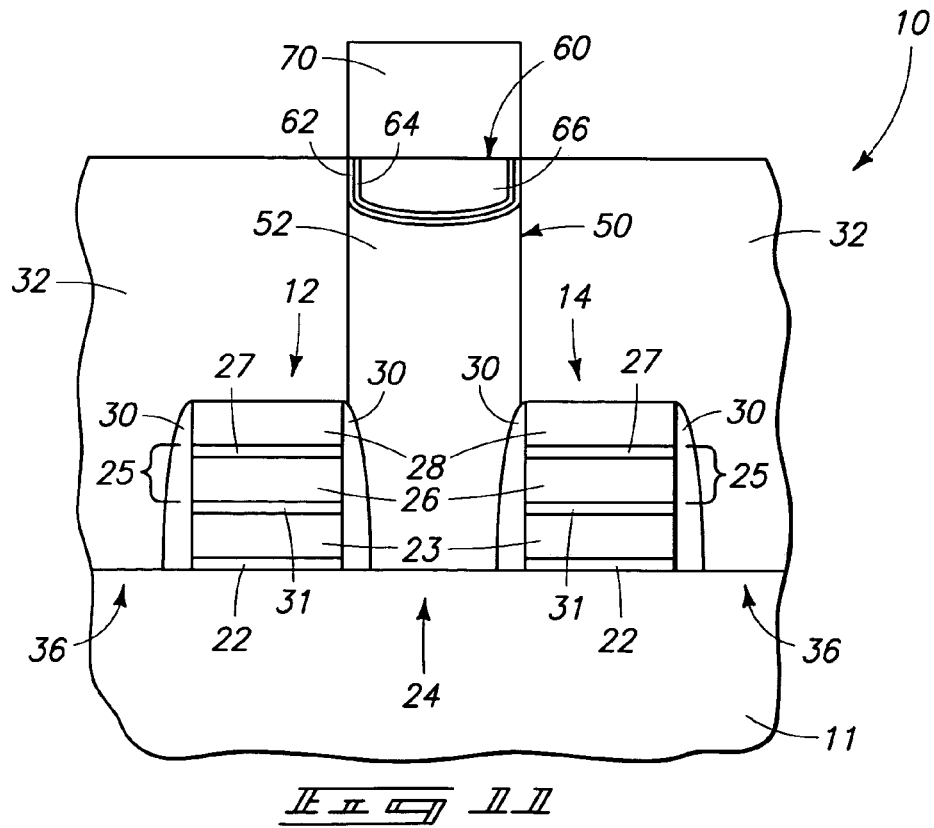
FIG. 11 is a view of the FIG. 10 substrate at a processing step subsequent to that depicted by FIG. 10.

Subsequent or other processing can, of course, also occur. For example, FIG. 10 depicts metal 60 having be planarized back, for instance by CMP. FIG. 11 depicts subsequent processing whereby a metal line 70, for example aluminum, has been fabricated in electrical connection with metal 60.

The above describes but one exemplary preferred implementation of the invention, and preferably in the context of FLASH memory fabrication by any method whether existing or yet-to-be developed, and which motivated the invention. However, the invention has applicability in FLASH and any circuitry outside of FLASH involving any method of forming a polysilicon-comprising plug wherein a substrate is provided which comprises some opening formed therein. Such opening might be formed in electrically insulative material, conductive material, and/or semiconductive material (and of course combinations thereof). Regardless, polysilicon is formed within the opening to less than fill the opening, and in some implementations regardless of whether a crevice is formed therein. The polysilicon within the opening is exposed to an $H_2$-comprising atmosphere and a temperature of at least 500° C., and in some implementations regardless of whether a crevice is present, and even if so regardless of whether such exposure is effective to remove the crevice, and/or independent of whether voids remain or are formed within the polysilicon. After such stated exposing, metal is formed within the opening over the polysilicon. Preferred attributes are otherwise as described above, for example with respect to conductivity doping, dopant activation, temperature, pressure, $N_2$ exposure, proximity of the polysilicon to the overlying metal, and/or time of exposure.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a polysilicon-comprising plug, comprising:
   providing a semiconductor substrate and an electrically insulative material over the substrate;
   forming an opening completely through the insulative material and uncovering an electrically conductive surface of the substrate through the opening;
   forming polysilicon within the opening to less than fill the opening and comprise a crevice therein, the polysilicon directly touching the insulative material and the conductive surface;
   conductively doping the polysilicon with a conductivity enhancing impurity;
   after doping the polysilicon, exposing the polysilicon within the opening to an $H_2$-comprising atmosphere and a temperature of from 900° C. to 1100° C. and removing the crevice, the exposing forming at least one sealed void within the polysilicon from the crevice and accomplishing a dopant activation anneal; and
   after the exposing, forming metal within the opening over and directly touching the polysilicon containing the at least one sealed void, the polysilicon within the opening not being exposed to $N_2$ prior to forming the metal and the polysilicon and metal forming a conductive contact plug in electrical connection with the conductive surface of the substrate.

2. The method of claim 1 wherein the exposing forms multiple sealed voids within the polysilicon from the crevice.

3. The method of claim 1 wherein the crevice is received between sidewalls of the opening more proximate to a center of the opening between the sidewalls than to said sidewalls.

4. The method of claim 1 wherein the opening comprises an aspect ratio of at least 7:1.

5. The method of claim 1 wherein forming metal within the opening forms a conductive contact plug comprising the polysilicon and the metal in electrical connection with a transistor source/drain region.

6. The method of claim 1 wherein the metal comprises a layer of a first metal and a layer of a different second metal and the metal does not extend above the opening.

7. The method of claim 1 wherein the insulative material has a thickness of from 6,000 Angstroms to 10,000 Angstroms.

8. A method of forming FLASH memory circuitry, comprising:
   forming a line of floating gates over a semiconductor substrate, and defining source areas in the semiconductor substrate on one side of the line proximate the floating gates and drain areas in the semiconductor substrate on another side of the line proximate the floating gates;
   forming insulative material elevationally above and laterally on both sides of the line of floating gates, the insulative material being over the source areas and the drain areas;
   forming a plurality of contact openings through the insulative material on the other side of the line of floating gates to the drain areas;
   forming polysilicon within the contact openings to less than fill the contact openings, the polysilicon directly touching the insulative material and the drain areas;
   conductively doping the polysilicon with a conductivity enhancing impurity;
   after doping the polysilicon, exposing the polysilicon within the contact openings to an $H_2$-comprising atmosphere and a temperature of from 500° C. to 850° C. the exposing to the $H_2$-comprising atmosphere and the temperature being ineffective as a dopant activation anneal;
   after the exposing to the $H_2$-comprising atmosphere and the temperature, forming metal within the contact openings over and directly touching the polysilicon; and
   prior to forming the metal, exposing the polysilicon within the contact openings to $N_2$ at conditions accomplishing a dopant activation anneal, the polysilicon and metal comprising conductive contact plugs in electrical connection with the drain areas.

9. The method of claim 8 wherein the openings comprise aspect ratios of at least 7:1.

10. The method of claim 8 wherein the temperature is from 700° C. to 850° C.

11. The method of claim 10 wherein the temperature is from 775° C. to 850° C.

12. The method of claim 8 wherein said exposing to the $H_2$-comprising atmosphere and the temperature is at subatmospheric pressure.

13. The method of claim 12 wherein the subatmospheric pressure is from 5 Torr to 20 Torr.

14. The method of claim 8 wherein the exposing to $N_2$ occurs prior to said exposing to the $H_2$-comprising atmosphere and the temperature.

15. The method of claim 8 wherein the exposing to $N_2$ occurs after the exposing to the $H_2$-comprising atmosphere and the temperature.

16. The method of claim 8 wherein the $H_2$ comprising atmosphere consists essentially of $H_2$.

17. The method of claim 8 wherein the $H_2$ comprising atmosphere consists of $H_2$.

18. The method of claim 8 wherein said exposing to the $H_2$-comprising atmosphere and the temperature is from 5 seconds to 2 minutes.

19. The method of claim 8 wherein the polysilicon in at least some of the contact openings comprises a crevice therein, the exposing to the $H_2$-comprising atmosphere and the temperature forming at least one sealed void within the polysilicon from the crevice.

20. The method of claim 19 wherein the exposing to the $H_2$-comprising atmosphere and the temperature forms multiple sealed voids within the polysilicon from the crevice.

21. The method of claim 8 wherein the metal comprises a layer of a first metal and a layer of a different second metal and the metal does not extend above the openings.

22. The method of claim 8 wherein the insulative material has a thickness of from 6,000 Angstroms to 10,000 Angstroms.

* * * * *

UNITED STATES PATENT AND TRADEMARK OFFICE
CERTIFICATE OF CORRECTION

PATENT NO. : 7,465,650 B2 Page 1 of 1
APPLICATION NO. : 11/106318
DATED : December 16, 2008
INVENTOR(S) : Derderian It is certified that error appears in the above-identified patent and that said Letters Patent is hereby corrected as shown below:

In column 8, line 19, in Claim 8, delete "do pant" and insert -- dopant --, therefor.

Signed and Sealed this

Twenty-fourth Day of March, 2009

JOHN DOLL
*Acting Director of the United States Patent and Trademark Office*